United States Patent
Wang et al.

(10) Patent No.: US 10,909,102 B2
(45) Date of Patent: Feb. 2, 2021

(54) SYSTEMS AND METHODS FOR PERFORMING SCALABLE LOG-STRUCTURED MERGE (LSM) TREE COMPACTION USING SHARDING

(71) Applicant: VMware, Inc., Palo Alto, CA (US)

(72) Inventors: Wenguang Wang, Santa Clara, CA (US); Richard P. Spillane, Mountain View, CA (US); Junlong Gao, Mountain View, CA (US); Robert T. Johnson, Palo Alto, CA (US); Christos Karamanolis, Los Gatos, CA (US); Maxime Austruy, Lausanne (CH)

(73) Assignee: VMware, Inc., Palo Alto, CA (US)

( * ) Notice: Subject to any disclaimer, the term of this patent is extended or adjusted under 35 U.S.C. 154(b) by 119 days.

(21) Appl. No.: 16/212,550

(22) Filed: Dec. 6, 2018

(65) Prior Publication Data
US 2020/0183905 A1    Jun. 11, 2020

(51) Int. Cl.
G06F 16/00    (2019.01)
G06F 16/22    (2019.01)
H03M 7/30    (2006.01)

(52) U.S. Cl.
CPC .......... *G06F 16/2246* (2019.01); *H03M 7/30* (2013.01)

(58) Field of Classification Search
CPC .................................................. G06F 16/2246
See application file for complete search history.

(56) References Cited

U.S. PATENT DOCUMENTS

| | | | |
|---|---|---|---|
| 2010/0185583 A1* | 7/2010 | Berinde | G06F 11/1461 707/610 |
| 2018/0307711 A1* | 10/2018 | Kulkarni | G06F 16/215 |
| 2018/0349095 A1* | 12/2018 | Wu | G06F 3/067 |
| 2019/0004768 A1* | 1/2019 | Li | G06F 7/24 |

OTHER PUBLICATIONS

Zhang Zigang et al : "Pipelined Compaction for the LSM-Tree", 2014 IEEE 28TH International Parallel and Distributed Processing Symposium, IEEE, May 19, 2014, pp. 777-786.*

* cited by examiner

*Primary Examiner* — Khanh B Pham
(74) *Attorney, Agent, or Firm* — Patterson + Sheridan, LLP

(57) ABSTRACT

Certain aspects provide systems and methods of compacting data within a log-structured merge tree (LSM tree) using sharding. In certain aspects, a method includes determining a size of the LSM tree, determining a compaction time for a compaction of the LSM tree based on the size, determining a number of compaction entities for performing the compaction in parallel based on the compaction time, determining a number of shards based on the number of compaction entities, and determining a key range associated with the LSM tree. The method further comprises dividing the key range by the number of shards into a number of sub key ranges, wherein each of the number of sub key ranges corresponds to a shard of the number of shards and assigning the number of shards to the number of compaction entities for compaction.

24 Claims, 7 Drawing Sheets

SYSTEMS AND METHODS FOR PERFORMING SCALABLE LOG-STRUCTURED MERGE (LSM) TREE COMPACTION USING SHARDING

BACKGROUND

Certain modern databases often use the write-optimized Log Structured Merge (LSM) tree data structure as the main indexing structure to organize on-disk data. The LSM tree is an immutable data structure, which means that existing data within the LSM tree is never updated and that new data is written to the LSM tree sequentially. As a result, storing data using an LSM tree data structure significantly reduces write amplification, such as in situations where the storage system that is used to store the data does not allow for data overwrites. Write amplification may refer to the ratio of the size of the actual data written to storage versus the size of the data that is requested by a write operation to be written to the storage. Also, data overwriting refers to new data replacing old data.

For example, in storage systems where old files are not allowed to be overwritten, an update to a single 4 kilobyte (KB) data block of an old 64 megabyte (MB) file results in a whole new 64 MB file being written to storage, where the new file is an exact copy of the old file except for the updated data block. In the example above, a 4 KB write is, therefore, amplified to be a 64 MB write. In contrast, with an LSM tree, as further described below, only the new 4 KB data block is written. The new 4 KB is written to a new file and has a key that is the same as the key of the old 4 KB data block in the old file.

Examples of data stores that do not allow for data overwrites include the Amazon Simple Storage Service (S3), which is a cloud computing web service that provides an object store through web services interfaces. Objects or files on Amazon S3 are immutable, meaning that an object has to be completely rewritten even if only one block in the object has changed.

An LSM tree comprises multiple levels of sorted data, where each level has a storage limit (e.g., predefined, configurable, etc.), such as a certain amount of data or a certain number of files. Because new data is continuously added to the different levels of an LSM tree, the LSM tree periodically gets "out-of-shape." An LSM tree is considered to be out-of-shape when, for example, the amount of data or the number of files stored by one or more levels of the LSM tree exceed the limit. In such cases, a process called compaction is invoked to compact the LSM tree and reclaim space. Compaction merges data stored in one level of the LSM tree with data stored in a higher level while ensuring that the merged data is sorted, among other things. Compaction is a very compute-intensive and time consuming process. Failing to complete a compaction in-time can result in an LSM tree staying "out-of-shape," which negatively impacts the read and write operations associated with the LSM tree.

BRIEF DESCRIPTION OF THE DRAWINGS

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
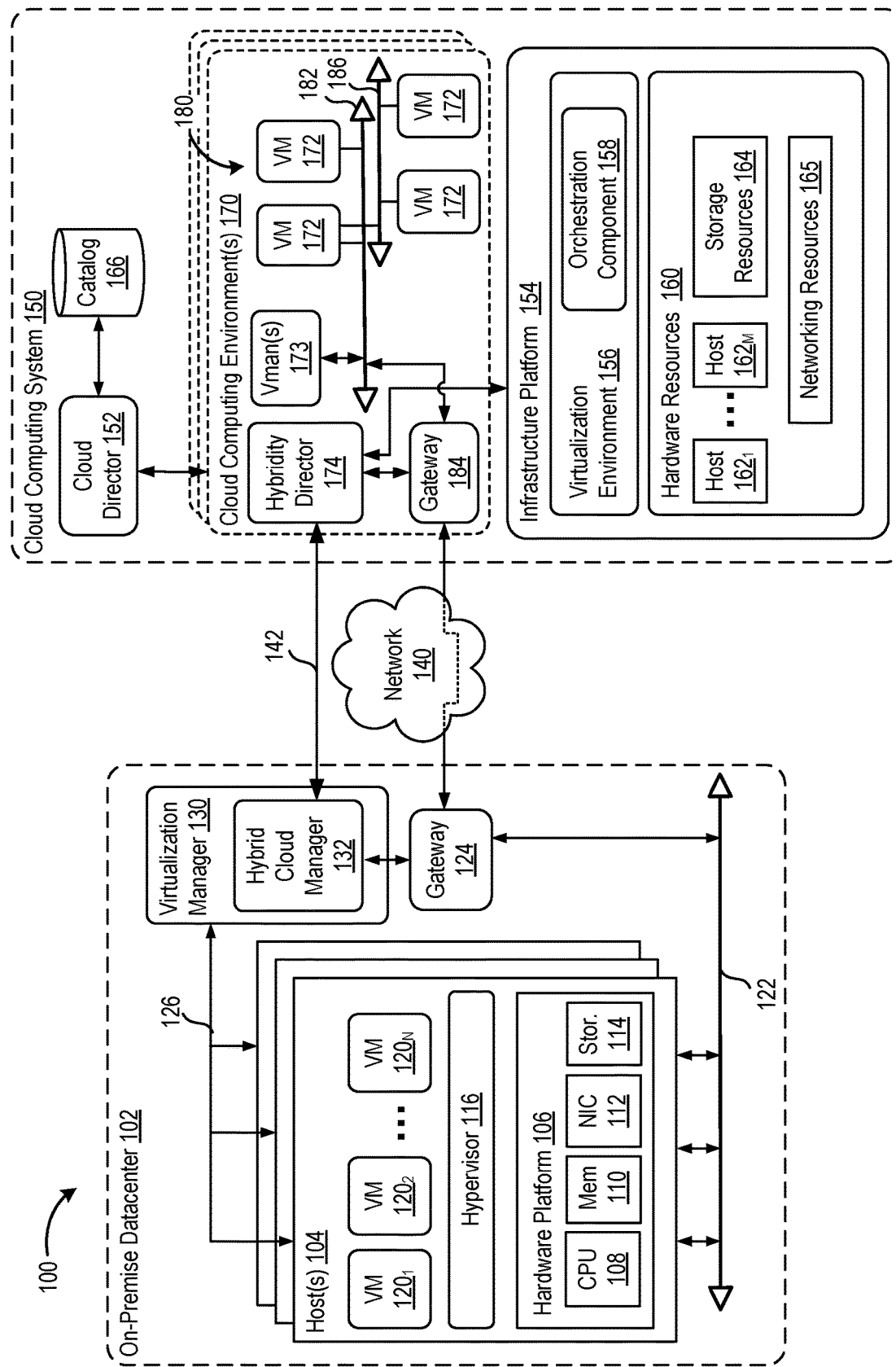
FIG. 1 is a block diagram of a hybrid cloud computing system in which one or more aspects of the present disclosure may be utilized.

Aspects of the present disclosure provide systems and methods for performing scalable LSM tree compaction using sharding. As described above, data may be stored using an LSM tree data structure in a data store or storage system that may not allow for data overwrites. For example, data may be stored in a data store provided by a public cloud computing system where files or objects are immutable. FIG. 1 provides an example of a hybrid cloud computing system 100, where certain data produced by an on-premise data center 102 is stored in a cloud computing system 150 where data overwrites may not be allowed. Note that the architecture shown in FIG. 1 is only one example of where the aspects of the present disclosure may be utilized. More specifically, the systems and methods of performing compaction using sharding can be used in connection with LSM trees stored in any storage system, regardless of whether the storage system is provided by a public or private cloud computing system or even an on-prem data center.

Also, although certain embodiments are described with respect to VMs, it should be noted that the same techniques may be applied to other types of VCIs. The term "VCI" may refer to VMs, containers, Docker containers (see, e.g., www.docker.com), data compute nodes, isolated user space instances, namespace containers, and the like. In addition, the same techniques may also be used by physical computing devices.

FIG. 1 is a block diagram of a hybrid cloud computing system 100 in which one or more aspects of the present disclosure may be utilized. Hybrid cloud computing system 100 includes a virtualized computing system implementing an on-premise datacenter 102 and a virtualized computing system implementing a cloud computing system 150. Hybrid cloud computing system 100 is configured to provide a common platform for managing and executing virtual workloads seamlessly between on-premise datacenter 102 and cloud computing system 150. In addition, cloud computing system is configured to provide on-premise datacenter 102 with additional and elastic storage capacity. On-premise datacenter 102 may be a data center controlled and administrated by a particular enterprise or business organization, while cloud computing system 150 may be operated by a cloud computing service provider and exposed as a service available to account holders, such as the particular enterprise in addition to other enterprises. As such, on-premise datacenter 102 may sometimes be referred to as a "private" cloud, and cloud computing system 150 may be referred to as a "public" cloud. In another example, cloud computing system 150 may also be a "private" cloud.

As used herein, an internal cloud or "private" cloud is a cloud in which a tenant and a cloud service provider are part of the same organization, while an external or "public" cloud is a cloud that is provided by an organization that is separate from a tenant that accesses the external cloud. For example, the tenant may be part of an enterprise, and the external cloud may be part of a cloud service provider that is separate from the enterprise of the tenant and that provides cloud services to different enterprises and/or individuals. In aspects disclosed herein, a hybrid cloud is a cloud architecture in which a tenant is provided with seamless access to both private cloud resources and public cloud resources.

On-premise datacenter 102 includes one or more host computer systems ("hosts 104"). Hosts 104 may be constructed on a server grade hardware platform 106, such as an x86 architecture platform. As shown, hardware platform 106 of each host 104 includes conventional components of a computing device, such as one or more processors (CPUs) 108, system memory 110, a network interface 112, storage system 114, and other I/O devices such as, for example, a mouse and keyboard (not shown). CPU 108 is configured to execute instructions, such as executable instructions that perform one or more operations described herein and that may be stored in memory 110 and in local storage. Memory 110 is a device allowing information, such as executable instructions, virtual disks, configurations, and other data, to be stored and retrieved. Memory 110 may include, for example, one or more random access memory (RAM) modules. Network interface 112 enables host 104 to communicate with another device via a communication medium, such as a network 122 within on-premise datacenter 102. Network interface 112 may be one or more network adapters, also referred to as a Network Interface Card (NIC). Storage system 114 represents local storage devices (e.g., one or more hard disks, flash memory modules, solid state disks, and optical disks) and/or a storage interface that enables host 104 to communicate with one or more network data storage systems. Examples of a storage interface are a host bus adapter (HBA) that couples host 104 to one or more storage arrays, such as a storage area network (SAN) or a network-attached storage (NAS), as well as other network data storage systems. Storage system 114 may also be representative of a storage virtualization platform, such as virtual SAN (VSAN) available by VMware, Inc., of Palo Alto, Calif.

A file system may be used to enable applications operating on hosts 104 (e.g., VMs 120) to interact with data stored in storage system 114 and/or storage resources provided by cloud computing system 150. One of a variety of file systems may be used for this purpose. One example is a virtual distributed file system (VDFS), which is a hyper-converged distributed portable operating system interface (POSIX) file system. VDFS refers to an interface between the computation layer (e.g., applications operating on hosts 104) and storage system 114. More specifically, VDFS has two sets of APIs, Southbound APIs (SAPIs) and Northbound APIs (NAPIs). SAPIs enable VDFS to connect with storage system 114, while NAPIs expose different APIs for applications operating on hosts 104 to be able to interact with data store in storage system 114 through VDFS. Note that VDFS is only one example of a file system that can be used to manage data storage in the storage resources provided by on-premise data center 102 and/or cloud computing system 150.

Each host 104 is configured to provide a virtualization layer that abstracts processor, memory, storage, and networking resources of hardware platform 106 into multiple virtual machines $120_1$ to $120_N$ (collectively referred to as VMs 120) that run concurrently on the same hosts. VMs 120 run on top of a software interface layer, referred to herein as a hypervisor 116, that enables sharing of the hardware resources of host 104 by VMs 120. One example of hypervisor 116 that may be used in an aspect described herein is a VMware ESXi™ hypervisor provided as part of the VMware vSphere® solution made commercially available from VMware, Inc. of Palo Alto, Calif. Hypervisor 116 may run on top of the operating system of host 104 or directly on hardware components of host 104. Also, in certain aspects, hypervisor 116 may comprise system level software as well as a privileged VM machine (not shown) that has access to the physical hardware resources of host 104.

On-premise datacenter 102 includes a virtualization management component (depicted in FIG. 1 as virtualization manager 130) that may communicate with the plurality of hosts 104 via a network, sometimes referred to as a management network 126. In certain aspects, network 122 and management network 126 may correspond to the same physical network, but different network segments, such as different subnets or different logical VLAN segments. In one aspect, virtualization manager 130 is a computer program that resides and executes in a central server, which may reside in on-premise datacenter 102, or alternatively, runs as a VM in one of hosts 104. One example of a virtualization manager is the vCenter Server™ product made available from VMware, Inc. Virtualization manager 130 is configured to carry out administrative tasks for on-premise data center 102, including managing hosts 104, managing VMs 120 running within each host 104, provisioning VMs, migrating VMs from one host to another host, and load balancing between hosts 104.

In one aspect, virtualization manager 130 includes a hybrid cloud management module (depicted as hybrid cloud manager 132) configured to manage and integrate virtualized computing resources provided by cloud computing system 150 with virtualized computing resources of on-premise data center 102 to form a unified "hybrid" computing platform. Hybrid cloud manager 132 is configured to deploy or instantiate VMs in cloud computing system 150, allow applications operating on hosts 104 to interact with data stored in the storage resources of cloud computing system 150, provide instructions to cloud computing system 150 for storing data produced by one or more hosts 104 in the storage resources of cloud computing system 150, and perform other "cross-cloud" administrative tasks, as described in greater detail later. In certain aspects, hybrid cloud manager 132 is a module or plug-in complement to virtualization manager 130, although other implementations may be used, such as a separate computer program executing in a central server or running in a VM in one of hosts 104. One example of hybrid cloud manager 132 is the VMware vCloud Connector® product made available from VMware, Inc.

In certain aspects, hybrid cloud manager 132 is configured to control network traffic into network 122 via a gateway component (depicted as a gateway 124). Gateway 124 (e.g., executing as a virtual appliance) is configured to provide VMs 120 and other components in on-premise datacenter 102 with connectivity to an external network 140 (e.g., Internet). Gateway 124 may manage external public IP addresses for VMs 120 and route traffic incoming to and outgoing from on-premise datacenter 102 and provide networking services, such as firewalls, network address translation (NAT), dynamic host configuration protocol (DHCP), load balancing, and virtual private network (VPN) connectivity over a network 140.

In certain aspects, cloud computing system 150 is configured to dynamically provide an enterprise (or users of an enterprise) with one or more cloud computing environments 170 in which a user may provision VMs 120, deploy multi-tier applications on VMs 120, and/or execute workloads. Cloud computing system 150 includes an infrastructure platform 154 upon which a cloud computing environment 170 may be executed. In the particular aspect of FIG. 1, infrastructure platform 154 includes hardware resources 160 having computing resources (e.g., hosts $162_1$ to $162_N$), storage resources 164, and networking resources 165, which are configured in a manner to provide a virtualization environment 156 that supports the execution of a plurality of virtual machines 172 across hosts 162. Storage resources 164 may include a storage area network (SAN), distributed virtual SAN, or network-attached storage (NAS) and other network data storage systems. Networking resources 165 may include switches, routers, and other network devices for connecting hosts 162 together and with network entities outside infrastructure platform 154. It is recognized that hardware resources 160 of cloud computing system 150 may in fact be distributed across multiple data centers in different locations.

Each cloud computing environment 170 may be associated with a particular tenant of cloud computing system 150, such as the enterprise providing on-premise data center 102. In certain aspects, cloud computing environment 170 may be configured as a dedicated cloud service for a single tenant comprised of dedicated hardware resources 160 (i.e., physically isolated from hardware resources used by other users of cloud computing system 150). In certain other aspects, cloud computing environment 170 may be configured as part of a multi-tenant cloud service with logically isolated virtualized computing resources on a shared physical infrastructure. As shown in FIG. 1, cloud computing system 150 may support multiple cloud computing environments 170, available to multiple enterprises in single-tenant and multi-tenant configurations.

In certain aspects, virtualization environment 156 includes an orchestration component 158 (e.g., implemented as a process running in a VM) that provides infrastructure resources to cloud computing environment 170 responsive to provisioning requests. For example, if an enterprise required a specified number of virtual machines to deploy a web application or to modify (e.g., scale) a currently running web application to support peak demands, orchestration component 158 can initiate and manage the instantiation of virtual machines (e.g., VMs 172) on hosts 162 to support such requests. In certain aspects, orchestration component 158 instantiates virtual machines according to a requested template that defines one or more virtual machines having specified virtual computing resources (e.g., compute, networking, storage resources). Further, orchestration component 158 monitors the infrastructure resource consumption levels and requirements of cloud computing environment 170 and provides additional infrastructure resources to cloud computing environment 170 as needed or desired. In one example, similar to on-premise datacenter 102, virtualization environment 156 may be implemented by running on hosts 162 VMware ESXi™-based hypervisor technologies provided by VMware, Inc. (although it should be recognized that any other virtualization technologies, including Xen® and Microsoft Hyper-V® virtualization technologies may be utilized consistent with the teachings herein).

In certain aspects, cloud computing system 150 includes a cloud director 152 (e.g., run in one or more virtual machines) that manages allocation of virtual computing resources to an enterprise for deploying applications. Cloud director 152 may be accessible to users via a REST (Representational State Transfer) API (Application Programming Interface) or any other client-server communication protocol. Cloud director 152 may authenticate connection attempts from the enterprise using credentials issued by the cloud computing provider. Cloud director 152 maintains and publishes a catalog 166 of available virtual machine templates and packaged virtual machine applications that represent virtual machines that may be provisioned in cloud computing environment 170. Cloud director 152 receives provisioning requests submitted (e.g., via REST API calls) and propagates such requests to orchestration component 158 to instantiate the requested virtual machines (e.g., VMs 172). One example of cloud director 152 is the VMware vCloud Director® produced by VMware, Inc.

In the aspect of FIG. 1, cloud computing environment 170 supports the creation of a virtual data center 180 having a plurality of virtual machines 172 instantiated to, for example, host deployed multi-tier applications, as well as one or more virtualization managers 173 (abbreviated as "Vman(s)"). A virtual data center 180 is a logical construct that provides compute, network, and storage resources to an organization. Virtual data centers 180 provide an environment where VMs 172 can be created, stored, and operated, enabling complete abstraction between the consumption of infrastructure service and underlying resources. VMs 172 may be configured similarly to VMs 120, as abstractions of processor, memory, storage, and networking resources of hardware resources 160. Virtualization managers 173 can be configured similarly to virtualization manager 130.

Virtual data center 180 includes one or more virtual networks 182 used to communicate between VMs 172 and managed by at least one networking gateway component (e.g., gateway 184), as well as one or more isolated internal networks 186 not connected to gateway 184. Gateway 184 (e.g., executing as a virtual appliance) is configured to provide VMs 172 and other components in cloud computing environment 170 with connectivity to external network 140 (e.g., Internet). Gateway 184 manages external public IP addresses for virtual data center 180 and one or more private internal networks interconnecting VMs 172. Gateway 184 is configured to route traffic incoming to and outgoing from virtual data center 180 and provide networking services, such as firewalls, network address translation (NAT), dynamic host configuration protocol (DHCP), and load balancing. Gateway 184 may be configured to provide virtual private network (VPN) connectivity over a network 140 with another VPN endpoint, such as a gateway 124 within on-premise datacenter 102. In other aspects, gateway 184 may be configured to communicate with on-premise datacenter 102 using a high-throughput, dedicated link (depicted as a direct connect 142) between on-premise datacenter 102 and cloud computing system 150. In one or more aspects, gateways 124 and 184 are configured to provide a "stretched" layer-2 (L2) network that spans on-premise datacenter 102 and virtual data center 180, as shown in FIG. 1.

While FIG. 1 depicts a single connection between on-premise gateway 124 and cloud-side gateway 184 for illustration purposes, it should be recognized that multiple connections between multiple on-premise gateways 124 and cloud-side gateways 184 may be used. Furthermore, while FIG. 1 depicts a single instance of a gateway 184, it is recognized that gateway 184 may represent multiple gateway components within cloud computing system 150. In some aspects, a separate gateway 184 may be deployed for each virtual data center, or alternatively, for each tenant. In some aspects, a gateway instance may be deployed that manages traffic with a specific tenant, while a separate gateway instance manages public-facing traffic to the Internet. In yet other aspects, one or more gateway instances that are shared among all the tenants of cloud computing system 150 may be used to manage all public-facing traffic incoming and outgoing from cloud computing system 150.

In certain aspects, each virtual data center 180 includes a "hybridity" director module (depicted as hybridity director 174) configured to communicate with the corresponding hybrid cloud manager 132 in on-premise datacenter 102 to enable a common virtualized computing platform between on-premise datacenter 102 and cloud computing system 150. Hybridity director 174 (e.g., executing as a virtual appliance) may communicate with hybrid cloud manager 132 using Internet-based traffic via a VPN tunnel established between gateways 124 and 184, or alternatively, using direct connection 142. In certain aspects, hybridity director 174 may control gateway 184 to control network traffic into virtual data center 180. In some aspects, hybridity director 174 may control VMs 172 and hosts 162 of cloud computing system 150 via infrastructure platform 154.

Because storage resources provided by on-premise datacenter 102 are limited, data produced or stored within on-premise datacenter 102 may, in certain cases, be transmitted to cloud computing system 150 for storage in storage resources 164. In such cases, the file system(s) (e.g., a distributed file system such as VDFS) operating within on-premise datacenter 102 may be configured to utilize storage resources 164 as secondary storage resources. In one example, the file system may be configured to cache hot data in storage system 114 and overflow cold data into storage resources 164. In other words, in such an example, storage system 114 is used by the file system as a read cache and write-back staging area while storage resources 164 are treated as disk storage. Hot data refers to data that is frequently accessed while cold data refers to data that is rarely accessed.

As described above, because a data store provided by a public cloud computing system may not allow for data overwrites, it is advantageous to store data in such a storage system using a LSM tree data structure. An LSM tree is a write-optimized data structure that performs sequential writes in batches. As described in relation to FIG. 3, an LSM tree comprises multiple levels. Within each level, data tuples ("tuples") are grouped into sorted string tables (SSTs). More specifically, a file system batches writes together in memory and writes them to storage as a sorted string table (SST), which is a sequential log. Each SST comprises one or more tuples of the LSM tree. Each tuple of the LSM tree comprises a key, which is a data block offset (e.g., offset of a 4 KB data block), and a value, which is the data block content (e.g., content of a 4 KB block).

Figure 2:
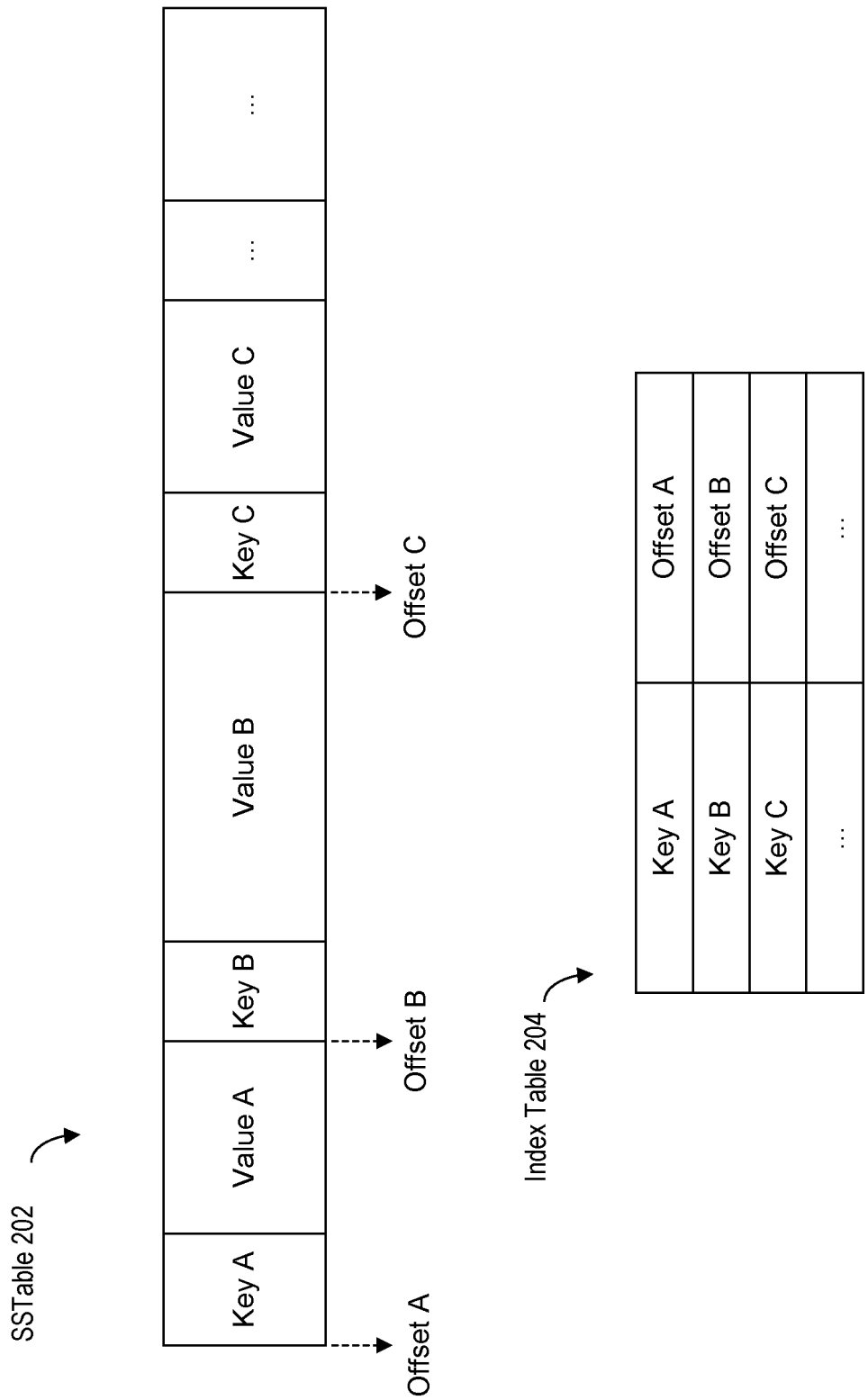
FIG. 2 illustrates an example of a sorted string table (SST) according to an aspect.

FIG. 2 illustrates an example of an SST. As shown, SST 202 comprises a group of sorted data tuples. For example, SST 202 comprises Key A and Value A, corresponding to a first tuple, Key B and value B, corresponding to a second tuple, and Key C and Value C corresponding to a third tuple. The sorted order of the keys within an SST makes finding a certain value within an SST table more efficient. For example, an I/O operation performed to read Value C in SST 202 is able to start sequentially scanning prior keys, Key A and Key B, until Key C and, therefore, Value C is found. In certain cases, in order to make I/O operations even more efficient, an index table, such as index table 204, may be created for each SST and held in memory. As shown, index table 204 maps keys associated with SST 202 with their corresponding offsets in SST 202. As such, a certain I/O operation in search of, for example, Key B would first consult index table 204 and find Offset B. Using Offset B, the corresponding Key B and, therefore, Value B may be more efficiently found in SST 202. Because an index table is much smaller in size than its corresponding SST, it can be cached locally. In certain aspects, if the whole index table 204 is not cached in memory, binary search may be used to find a specific key in index table 204 using an order of log N operations, which is more efficient than sequentially scanning index table 204 and does not have a high memory requirement of storing the whole index table 204 in memory. In such aspects, parts of index table 204 that are accessed frequently may be cached in a region of memory that is much smaller than the overall size of index table 204.

In certain aspects, a certain limit is defined for each SST, which the file system stores as a file. For example, a user-defined and tunable size limit may limit the size of data in each SST. In another example, each SST may only be allowed to include a certain number of tuples. When data within an SST reaches the limit, the file system creates a new SST for storing additional data. Also, in certain aspects, each SST is an immutable representation of tuples such that, for example, an update to data associated with a tuple that is already stored in an existing SST table does not overwrite the tuple in the existing SST table. Instead, the file system writes the update to a new SST table with a key that is the same key as the tuple's key.

Figure 3:
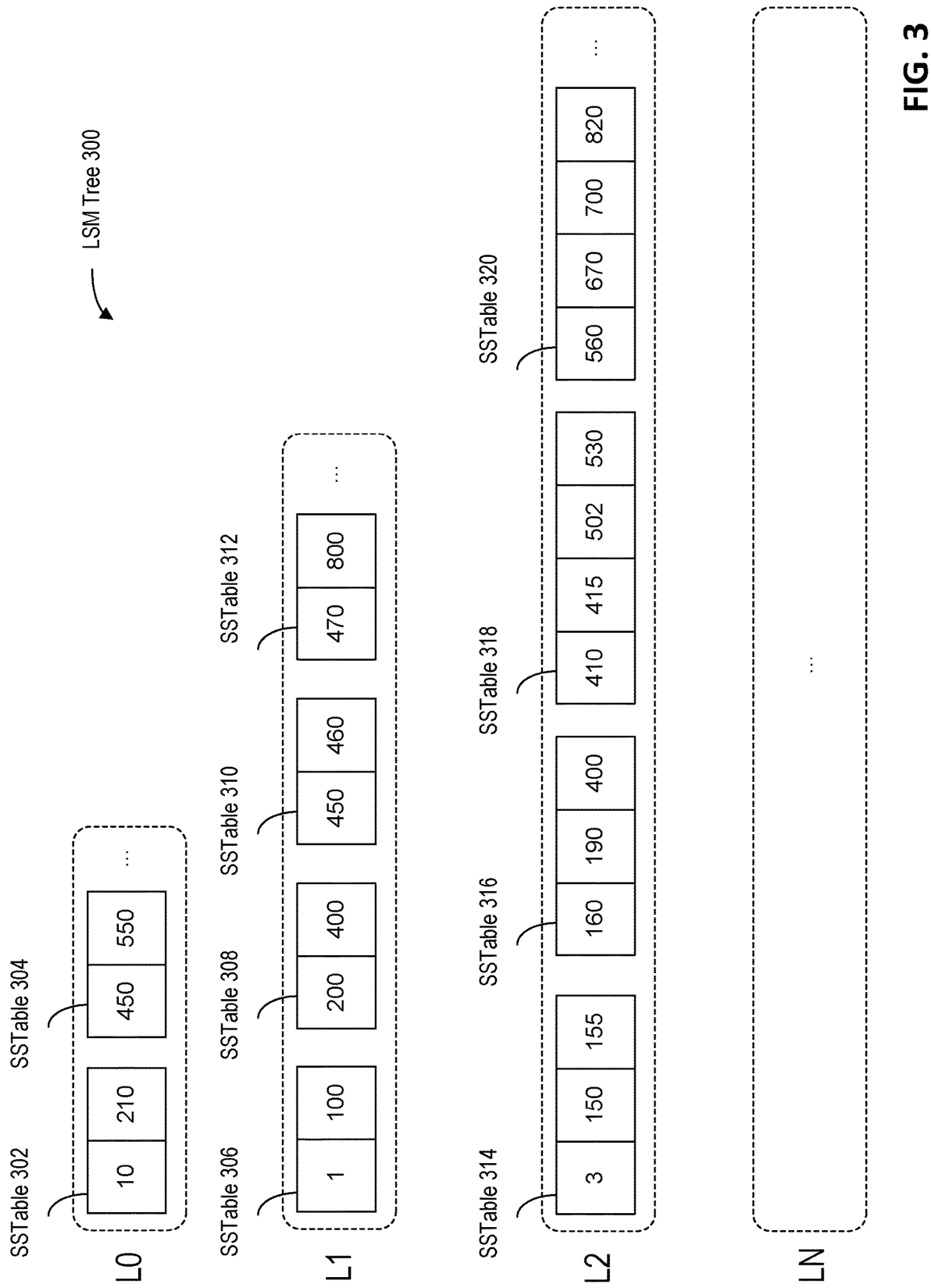
FIG. 3 illustrates an example LSM tree with levels 0 through N ("L0 through LN").

FIG. 3 illustrates an example LSM tree 300 with levels 0 through N ("L0 through LN"). L0 is the lowest level while LN is the highest. As shown, each level of LSM tree 300 comprises a number of SSTs. The number of SSTs and, therefore, the amount of data in each level increases as the level number goes up. When updates arrive, the file system batches them together and stores them in the form of SSTs in L0. For example, L0 of LSM Tree 300 comprises SST 302 and SST 304. For simplicity, only the keys are shown in each SST of FIG. 3. In other words, SST 302 comprises key 10, whose corresponding value (e.g., block content) is not shown, as well as key 210, whose value is also not shown.

Data within L0 eventually flows to higher levels (e.g., L1-LN) through a process called compaction, as described below. Typically, an LSM tree is configured such that keys or key ranges associated with the SSTs in L0 are unsorted and overlapping while SSTs stored in L1-LN are sorted and cover disjoint (e.g., non-overlapping) key ranges.

As shown, as the level number increases, the number of SSTs held per level increases exponentially in order to limit the overall depth of LSM Tree 300. Generally, a limit is defined for the amount of data or the number SSTs each level is allowed to hold. For example, L0 may be configured to only include an X number of SSTs or an X amount of data. L1's limit, on the other hand, may exponentially increase to 4× while L2's limit may be 16×. When data that is stored in a level exceeds the defined limit, the LSM tree is said to be "out-of-shape." For example, if L0 is configured to hold only three SSTs but is instead holding eight SSTs, the tree is determined to be "out-of-shape" by the file system.

In certain aspects, a file system is able to determine whether an LSM tree is out-of-shape by examining a catalogue file associated with the LSM tree. A catalogue file is generally created to enable a file system to efficiently find SSTs within a corresponding LSM tree. The catalogue file serves as a superblock of the on-disk representation of a corresponding LSM tree and includes metadata associated with each SST, including the SST's name and key range. In one example, a superblock is a record of the characteristics of a filesystem, including its size, the block size, the empty and the filled blocks and their respective counts, the size and location of the inode tables, the disk block map and usage information, and the size of the block groups. The catalogue file is cached locally and uploaded to disk per update.

In aspects where storage system 114 is used as primary storage for caching hot data, as was discussed, the file system associated with storage system 114 may cache the catalogue file locally in storage system 114 and upload it to storage resources 164 per update. In such aspects, the file system may periodically de-stage or transfer data to storage resources 164 by writing dirtied data (e.g., new updates or fresh data) as tuples to an LSM tree stored in storage resources 164. A catalogue file is updated when data within a corresponding LSM tree is changed, such as when new SSTs are added to the LSM tree etc.

A de-staging may be triggered by either an RPO (Recovery Point Objective) or based on the number of dirtied tuples in storage system 114 (e.g., used as local cache here) to reduce pressure on storage system 114. In certain aspects, an RPO represents the age of files that need to be recovered from storage resources 164 for normal operations to resume in case of a failure. In certain aspects, if storage system 114 is configured with a certain RPO, data may be de-staged from storage system 114 to storage resources 164 at least once per RPO period. More specifically, in certain aspect, the file system associated with storage system 114 de-stages data to an LSM tree stored in storage resources 164. When de-staging data, as described above, tuples of dirty blocks are batched into several SSTs, each having a tunable size limit, and appended to L0 of the LSM tree. Deleting a tuple is treated as a special case of updating the tuple. For example, the file system can delete an old tuple by writing an empty value in a new tuple for the key as the "tombstone" to signify that the corresponding old tuple with the same key has been "unmapped."

Because all writes are appended into new SSTs, the space usage or the number of SSTs within each level (e.g., L0) eventually exceeds a defined limit. Also, as old SSTs are not updated (e.g., an update to an old SST is written into a new SST with the same key), SSTs with redundant keys are created to supersede the old SSTs, resulting in redundancy. Deletions are also treated as a form of update, also resulting in redundancy. As a result, a process called compaction is invoked periodically to reclaim space, eliminate redundancy, and ensure that data stored within each level does not exceed the level's defined limit. Compaction picks a whole level of SSTs (e.g., SSTs in L0) and merges them into the lower levels (e.g., L1) while ensuring that SSTs in the lower levels are sorted and cover disjoint key spaces. During compaction, if different levels have duplicated keys, only the tuple at the lowest level (e.g., the level with the smaller level number) is kept. The tombstone tuple is deleted once it reaches the highest level (e.g., the level with the largest level number).

Figure 4:
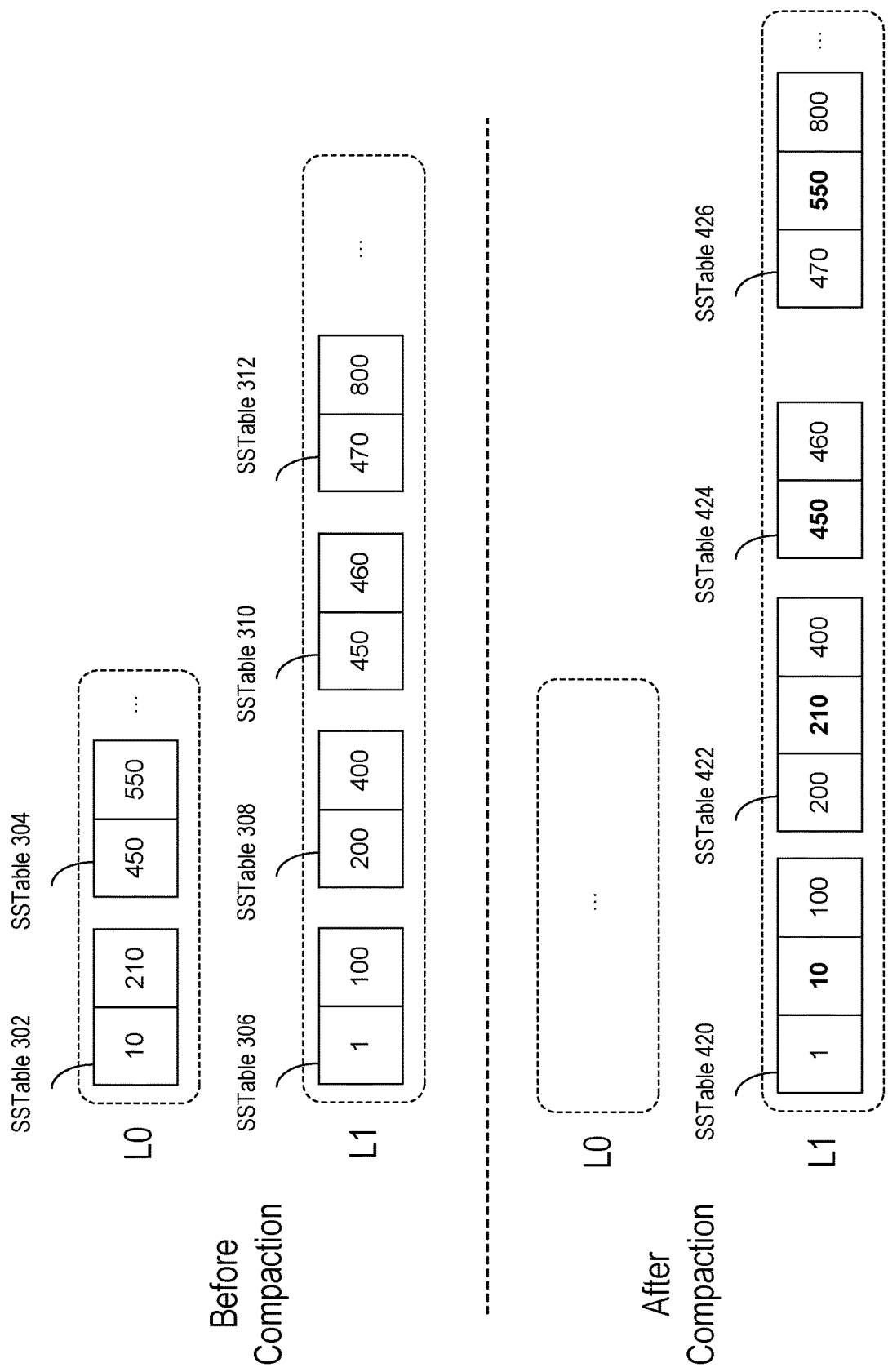
FIG. 4 illustrates an example compaction of the L0 and L1 of the LSM tree of FIG. 3, according to an aspect.

FIG. 4 illustrates an example compaction of L0 and L1. As shown, before compaction, L0 comprises SST 302, having keys 10 and 210, and SST 304, having keys 450 and 550. Also, before compaction, L1 comprises SST 306, having keys 1 and 100, SST 308, having keys 200 and 400, SST 310, having keys 430 and 460, and SST 312, having keys 470 and 800. As described above, during compaction, tuples of SSTs within L0 are merged with tuples of SSTs within L1. For example, the compaction process merges SST 302 of L0 with SST 306 and SST 308 of L1. As shown, as a result of the compaction, a new SST 420 is created and stored within L1 that comprises keys 1 and 100 from SST 306 as well as key 10 from SST 203. When keys from different SSTs are merged, the compaction process sorts them. For example, in SST 420, key 10 is placed between keys 1 and 100. A new SST 422 is also created that comprises keys 200 and 400 from SST 308 and key 210 from SST 302. Similar to SST 420, SST 422 is also sorted such that key is 210 is placed between keys 200 and 400.

When merging SST 304 and 310, the compaction process eliminates the redundant keys, which is key 450 in this example, by selecting the key that is more recently written to the LSM tree. For example, between key 450 of SST 304 and key 450 of SST 310, the compaction process is configured to select key 450 of SST 304 as being associated with the most recently written tuple. In certain aspects, each tuple may comprise a time stamp, based on which the compaction process is able to determine which tuple is the newest. The newly created SST 424, therefore, comprises key 450 of SST 304 and key 460 of SST 310. SST 426 is also created as a result of the merging of key 550 of SST 304 and keys 470 and 800 of SST 312.

After the compaction of L0 and L1 is completed, space is reclaimed in L0 and L1 because SST 302 and 304 of L0 and SSTs 306-312 of L1 are deleted when no older catalogue files point (e.g., older version of the current catalogue file) to these SST. Also, any redundancies between the two levels are now eliminated. Note that for simplicity, the compaction of only two levels of L0 and L1 are shown in FIG. 4. However, an LSM tree, as shown in FIG. 3, may comprise many other levels that might also be involved in the compaction. For example, as data flows from L0 to L1, L1 may also exceed its defined size limit, in which case, the extra SSTs flow to L2. As a result, subsequent SSTs generated in L1 will be compacted with SSTs in L2 with which they overlap. The compaction process continues until none of the levels of the LSM tree exceeds its defined size limit. In another example, L0, L1, and L2 may be compacted in one pass and be stored in L3.

One of ordinary skilled in the art recognizes that the compaction shown in FIG. 4 is simplified and merely exemplary. Further, one of ordinary skilled in the art also recognizes that one of a variety of methods may be used for merging SSTs from different levels of the LSM tree together. In one example, the compaction process may compare keys in SSTs of the different levels in order to find the lowest key to include in a new SST. Once the lowest key from all levels is found, the compaction process identifies the second lowest key from all levels and appends it to the lowest key in the new SST and so on. Also, when a certain SST reaches its size limit, the compaction process starts a new SST to continue the merging process.

Compaction is a very storage-heavy and time consuming process, especially when it comes to data in the scale of petabytes. This is because compaction typically involves reading several levels of SSTs, merging the SSTs from the different levels, and then writing new and sorted SSTs back into the LSM tree. Failing to complete compaction in a timely manner can result in the LSM tree staying in an inefficient representation with a poor look up and range scan performance. Compaction of an LSM tree also uses so much of a system's compute resources that write operations to the LSM tree are often stalled or slowed down during the compaction.

As a result, certain embodiments described herein relate to sharding the compaction of an LSM tree into a number of parallel processes based on the key range associated with the LSM tree.

Figure 5:
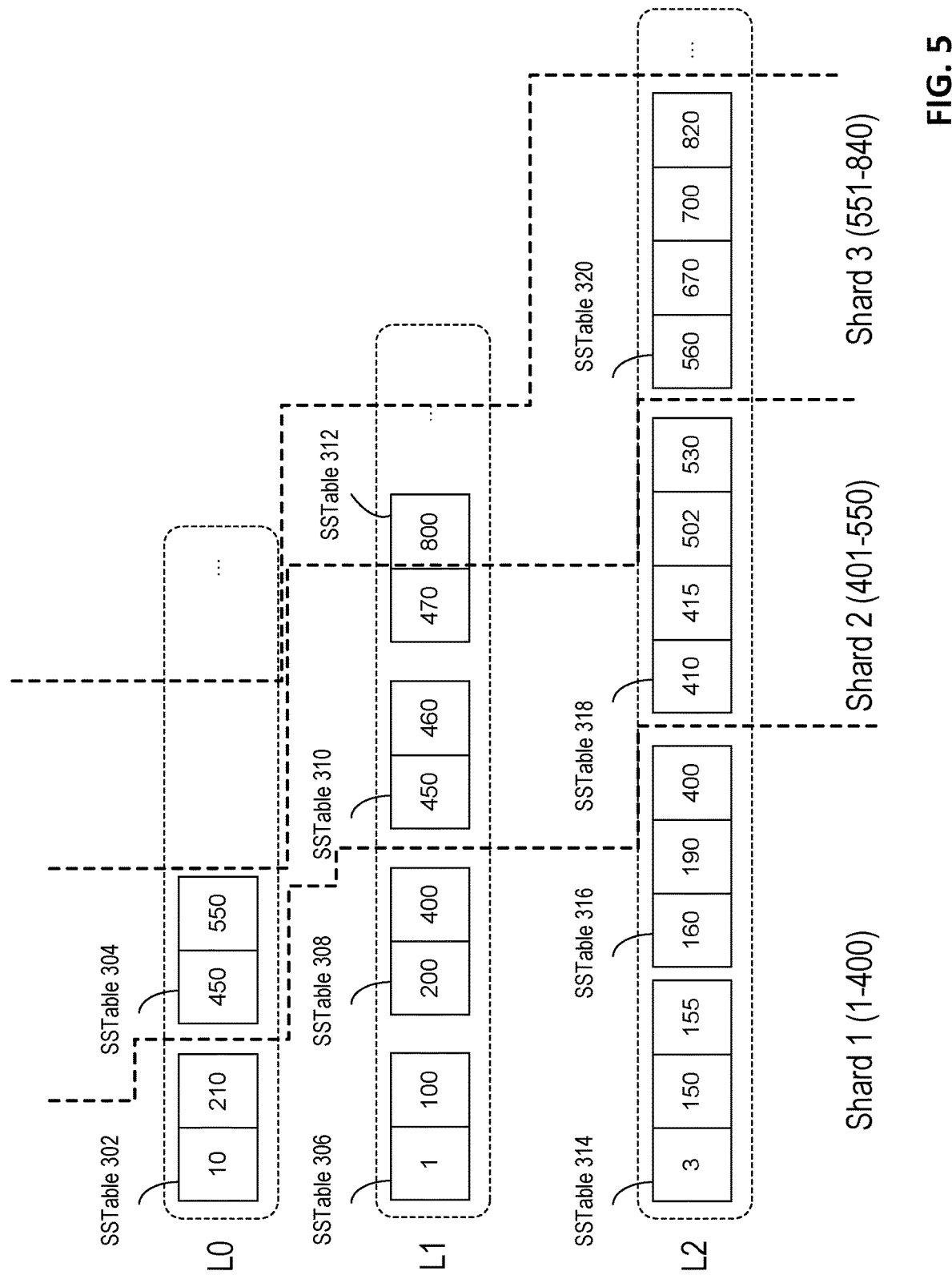
FIG. 5 illustrates a visual example of how the compaction of an LSM tree with three levels, L0-L2, may be performed using sharding, according to an aspect.

FIG. 5 illustrates a visual example of how the compaction of an LSM tree with three levels, L0-L2, may be performed using sharding. In the example of FIG. 5, the key range associated with the LSM tree is divided up into a number of shards. A key range of an LSM tree refers to a range starting from the lowest key to the highest key in the LSM tree. In the example of FIG. 5, the lowest key is 1 while the highest key is 820. In order to determine a key range of an LSM tree, a compute resource in charge of performing the compaction may be configured to examine the catalogue file or the index table associated with the LSM tree. Note that, in certain aspects, this compute resource may be a host or a virtual machine. If the aspects described herein are utilized in connection with the hybrid architecture shown in FIG. 1, the compute resource, in certain aspects may be operate within on-premise data center 102 (e.g., VM 120) and, in certain other aspects, it may operate within in cloud computing system 150 (e.g., VM 172).

Based on a read of the index table or the catalogue file, the compute resource is able to determine the lowest and the highest keys. This can be done because the catalogue file already records the key range associated with each SST. In another example, the compute resource may instead read all the SSTs in the LSM tree to find the key range. Once the key range is determined, the compute resource is configured to divide up the key range into different sub key ranges based on the number of shards, where each sub key range (e.g., a subset of keys from the keys in the key range) corresponds to one of the number of shards. For example, in FIG. 5, the key range 1-820 has been divided up to three sub key ranges, each covering a different sub-range of keys including 1-400, 401-550, and 551-820. Note that in the example of FIG. 5, the different sub key ranges associated with different shards do not comprise the same number of keys. For example, the first sub key range covers a range of 400 keys (400-1), while the second sub key range covers 150 keys (550-401), and the third sub key range covers 270 keys (820-551). In certain aspects, however, the sub key range may be selected such that they would each cover the same or almost the same number of keys, for example, within a certain margin (e.g., 1-10 keys). In such aspects, the key range in FIG. 5 may be divided into three sub key ranges, the first sub key range covering keys 1-273, the second sub key range covering keys 274-546, and the third sub key range covering 547-820.

In certain aspects, the compute resource in charge of managing the compaction may calculate the number of shards based on the amount of time ("N") (e.g., estimated amount of time) it may take to compact an LSM tree (e.g., data within the LSM tree). In one example, the amount of time N may be calculated based on the LSM tree size ("S"), the I/O bandwidth ("B"), and the RPO ("T") in seconds. S may be measured in megabytes (MB) and refers to the entire size of the LSM tree. B may be measured in MB per second (MB/S) and refers to the volume of data that can be read from the LSM tree or written to the LSM tree in one second. B may be based on the disk speed and network throughput.

An example of a formula used to calculate N is:

$$N = 2S/(B*T)$$

To illustrate this formula with an example, if S is 100 megabytes (MB), B is 10 MB/S, and T is 5 seconds, then N would be 4 seconds. Based on N, a number of compaction processes or, alternatively, compute resources (both denoted as "R") may be calculated to perform the compaction in parallel. In certain aspects, compute resource may be VMs, as further described below. Compaction processes or compute resources may be referred to herein as compaction entities. To perform such a calculation, in one example, the following example formula may be used:

$$\text{Number of Compaction Entities} = N*(1+E)$$

In the above formula, E is a defined (e.g., user-defined or configured) percentage that may be calculated based on a likelihood of compaction entities failing during the compaction or a prediction as to whether or how many of the compaction entities may fail during the compaction. For example, assuming some compute resources may fail during the compaction, a higher number of compute resources may be initiated to perform the compaction on time. In another example, E may be defined based on how quickly the compaction is expected to be performed. For example, a user may prefer to perform a compaction in 75% of the calculated compaction time N. In such an example, E may be 25%, in which case, R=N*(1+25%). If N is 4 seconds, then R equals 5, meaning 5 processes or compute resources may be assigned to performing the compaction in parallel.

The number of shards is then calculated based on R. An example formula for calculating the number of shards using R is:

$$\text{Shards} = R/E$$

For example, if R is 5 and E is 25%, then the number of shards is 20. It is advantageous to have a higher number of shards than the number of compaction entities. This advantage can be illustrated with an example, which may involve a compaction that is supposed to take 10 seconds to complete. If there are two compute resources and two shards (each compute resource taking 10 seconds to compact its shard) and the first compute resource fails 8 seconds into compacting the first shard, a new compute resource (e.g., a third compute resource) will have to start compacting the first shard from scratch, in which case, the compaction may take longer than 10 seconds to complete. However, if there are a higher number of shards, such as 10 shards, then it would take each compute resource 2 seconds to compact each shard (assuming the shards approximately have the same size). In that case, if the first compute resource fails during the compaction of a certain shard, only less than two seconds have been wasted. In that case, a third compute resource may be assigned the work that was previously assigned to the first compute resource and helps with completing the overall compaction on time or, at least, in less time than if fewer shards were calculated for the compaction.

Once the number of shards is calculated, the key range associated with the LSM tree can be divided based on the number of shards into a number of sub key ranges. For example, if the key range is 1-840 and the number of shards is 10, then each shard may cover 84 keys. In certain aspects, a key range is divided such that sub key ranges associated with different shards would cover disjoint or non-overlapping keys.

Once the number of shards is determined, in certain aspects, each compaction entity is configured to compact tuples in a sub key range associated with a shard. In certain aspects, a compaction entity may compact more than one shard. In certain aspects, because the catalogue file associated with the LSM tree tracks the key range associated with each SST in each level of the LSM tree, each compaction entity is able to efficiently find corresponding SSTs in higher levels (e.g., SSTs that cover or correspond to the same key range in different levels), while scanning through the relevant SSTs in L0 of the LSM tree within a certain key range. Having found all SSTs relevant to a certain sub key range in all levels, the compaction entity is then able to merge the SSTs. In the example of FIG. 5, based on the catalogue file, a compute resource in charge of compacting Shard 1, may determine that the SSTs corresponding to sub key range 1-400, associated with Shard 1, include SST 302 of L0, SSTs 306-308 of L1, and SSTs 3140316 of L2. The compute resource then merges the SSTs. Other compute resources may similarly compact Shard 2 and Shard 3.

As described above, in one example, the sharding techniques described herein may be utilized in connection with the hybrid cloud architecture shown in FIG. 1. Also, as described above, an example use-case of the hybrid cloud architecture in FIG. 1 involves the usage of storage system 114 to cache hot data while using storage resources 164 as disk storage for storing data using the LSM tree data structure. In such aspects, a file system operating within on-premise data center 102 de-stages data to storage resources 164 at least once during each RPO. The file system may then be configured to determine (e.g., periodically) whether an LSM tree storing the de-staged data is out-of-shape. Upon determining that the LSM tree is out-of-shape, the file system is then configured to cause the LSM tree to be compacted as further described in relation to the operations of FIGS. 6 and 7.

Figure 6:
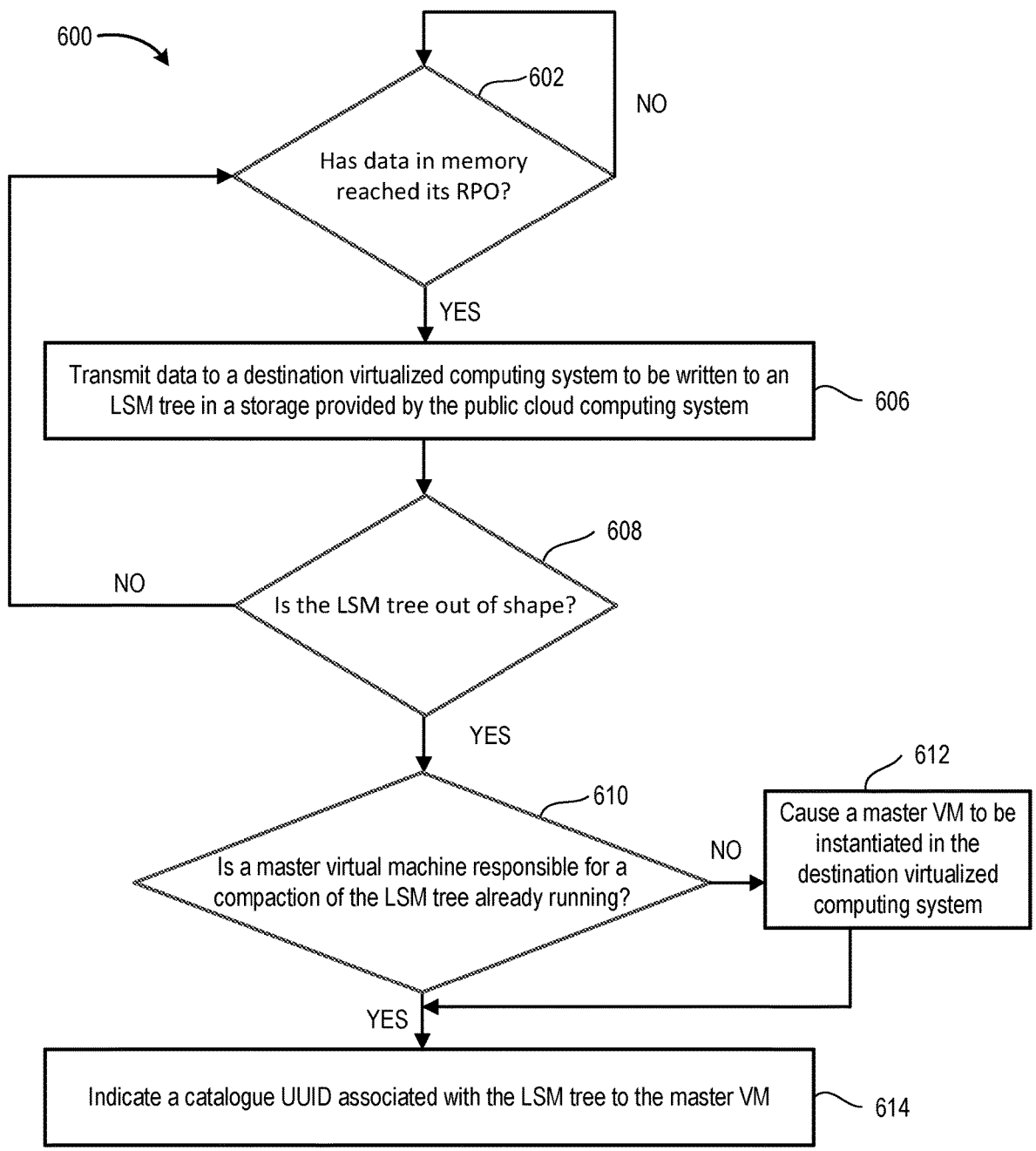
FIG. 6 illustrates example operations performed by a file system, according to certain aspects.

FIG. 6 illustrates operations 600 performed by a file system, according to certain aspects. In one example, the file system is associated with one or more hosts 104 of on-premise datacenter 102. An example of a file system, as described above, is VDFS, which may operate "on top" of a VSAN cluster within on-premise data center 102. Steps 602-614 of operations 600 are described below with reference to FIGS. 1-5.

At block 602, the file system determines if the data within storage system 114 has reached its RPO. If not, then the operation loops back to block 602 to periodically check whether data within storage system 114 has reached its RPO. If yes, the operation proceeds to block 606.

At block 606, the file system transmits or de-stages data that has reached its RPO to cloud computing system 150 for storage in storage resources 164. As an example, the file system may send an indication to hybrid cloud manager 132 to coordinate with hybridity director 174 so that data de-staged and transmitted from on-premise data center 102 to cloud computing system 150 would be stored in storage resources 164 using an LSM tree data structure. As described above, the file system creates and locally caches a catalogue file and/or an index table for the LSM tree in storage system 114.

At block 608, the file system determines whether the LSM tree in storage resources 164 is out-of-shape. The file system is able to make this determination based on the locally cached catalogue file and/or index table associated with the LSM tree. If the file system determines that the LSM tree is not out-of-shape, in certain aspects, the file system is configured to loop back to block 602. If the file system determines that the LSM tree is out-of-shape, the file system moves to block 610.

At block 610, the file system is configured to determine if a master VM within cloud computing system 150 is already running. For example, a master VM may have previously been instantiated for managing the compaction of the LSM tree stored in storage resources 164. If that is not the case, then at block 612, the file system may be configured to cause a master VM to be instantiated and start executing within cloud computing system 150. In one example, the file system may instantiate a master VM by making a request to hybridity director 174 through hybrid cloud 132. In response to the request, the hybridity director 174 may then cause orchestration component 158 to instantiate the master VM. In one example, the master VM is in instantiated within a cloud computing environment 170 associated with on-premise data center 102.

At block 614, upon determining that a master VM is already running or upon instantiating a master VM, the file system indicates a catalogue file UUID associated with the LSM tree to the master VM. As described above, the catalogue file is uploaded to disk periodically. As a result, once the master VM receives the UUID of the catalogue, it is able to access the on-disk catalogue associated with the LSM tree.

Figure 7:
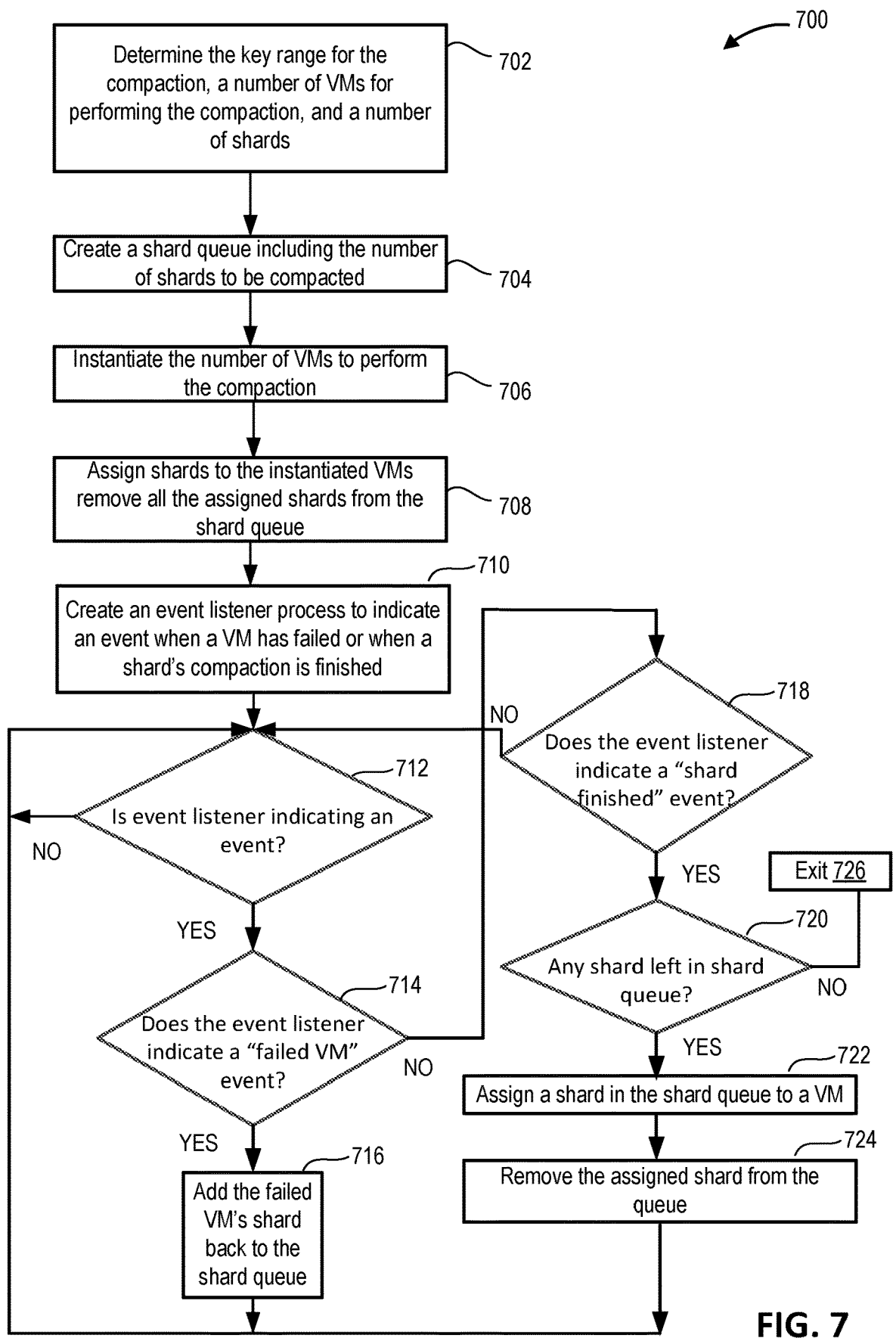
FIG. 7 illustrates example operations performed by a master VM, according to certain aspects.

FIG. 7 illustrates operations 700 performed by a master VM, according to certain aspects. An example master VM runs within cloud computing system 150. Steps 702-714 of operations 700 are described below with reference to FIGS. 1-6.

At block 702, the master VM determines the key range associated with the LSM tree for the compaction, the number of VMs for performing the compaction, and the number of shards, as described above. As an example, the master VM may calculate 20 shards, Shard 1-20, and 5 VMs, VMs 1-5.

At block 704, the master VM creates a shard queue that includes the number of shards be compacted.

At block 706, the master VM instantiates the number of VMs to perform the compaction of the LSM tree. For example, the master VM makes a request to orchestration component 158 to instantiate the VMs. In the example above, orchestration component 158 instantiates VMs 1-5. When the VMs are instantiated, they remain idle until they are assigned work by the master VM. In certain aspects, the master VM may also perform compaction.

At block 708, the master VM assigns shards to the instantiated VMs and removes the assigned shards from the shard queue. Note that the number of shards is larger than the number of VMs and, therefore, only a certain percentage of all the shards are assigned to the VMs for compaction. The unassigned shards remain in the shard queue until the VMs finish the compaction of the assigned shards and become available.

At block 710, the master VM creates an event listener to indicate an event when a VM has failed or when a shard's compaction is finished. The event listener is configured to identify if a VM that is assigned a shard fails during the compaction. In that case, the event listener indicates a "failed VM" event. The event listener is also configured to identify when a shard that has been assigned to a VM for compaction is compacted. In that case, the event listener indicates a "finished shard" event.

At block 712, the master VM determines whether the event indicate an event. If yes, the master event proceeds to block 714. If not, the master VM loops back to block 712. Configuring the master VM to loop back to block 712 allows the master VM to continue to check whether the event listener indicates an event.

At block 714, the master VM determines whether the event listener indicate a failed VM event. If yes, the master VM proceeds to block 716. If not, the master VM proceeds to block 718.

At block 716, the master VM adds the failed VM's shard back to the shard queue. After adding the failed VM to the shard queue, the master VM loops back to block 712 to determine whether the event listener is indicating any additional events.

At block 718, the master VM determines whether the event listener indicates a shard finished event. If yes, the master VM proceeds to block 720. If not, the master VM loops back to block 712.

At block 720, the master VM determines if there is any shard left in the shard queue. In other words, the master VM determines whether there are any unassigned shards. If yes, the master VM proceeds to block 722. If there are no shard lefts in the shard queue, then the master VM process to block 726 to exit.

At block 722, the master VM assigns the shard in the shard queue to an available VM. An available VM at this point is a VM that has finished compacting a shard and is now idle.

At block 724, the master VM removes the shard that was assigned to a VM at block 722 from the shard queue. After removing the assigned shard from the shard queue, the master is configured to loop back to block 712.

Accordingly, the aspects described herein provide a sharding technique for dividing the compaction of an LSM tree into a number of parallel processes based on the key range of the LSM tree. Utilizing the sharding techniques described herein in connection with the hybrid cloud architecture is especially advantageous. For example, when storage system 114 is used as primary storage for caching hot data and storage resources 164 are used for disk storage, instantiating VMs within cloud computing system 150 to perform the compaction of an LSM tree significantly reduces the time of compaction. This ensures that the compaction is performed on time so that the LSM does not stay in an inefficient representation resulting in a poor look up and range scan performance. In addition, utilizing VMs in cloud computing system 150 to perform the compaction frees up the compute resources within on-premise datacenter 102, thereby, allowing I/O operations to the LSM tree to continue without performance degradation during the compaction.

The various aspects described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more aspects of the invention may be useful machine operations. In addition, one or more aspects of the invention also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various aspects described herein may be practiced with other computer system configurations including handheld devices, microprocessor systems, microprocessor-based or programmable consumer electronics, minicomputers, mainframe computers, and the like.

One or more aspects of the present invention may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, volatile random-access memory, non-volatile random-access memory (e.g., phase change memory, 3D crosspoint memory), solid state disk (a flash memory device) with non-volatile memory express (NVMe) or serial advanced technology attachment (SATA) or other interfaces, a CD (Compact Discs)—CD-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

Although one or more aspects of the present invention have been described in some detail for clarity of understanding, it will be apparent that certain changes and modifications may be made within the scope of the claims. Accordingly, the described aspects are to be considered as illustrative and not restrictive, and the scope of the claims is not to be limited to details given herein, but may be modified within the scope and equivalents of the claims. In the claims, elements and/or steps do not imply any particular order of operation, unless explicitly stated in the claims.

Virtualization systems in accordance with the various aspects may be implemented as hosted aspects, non-hosted aspects or as aspects that tend to blur distinctions between the two, are all envisioned. Furthermore, various virtualization operations may be wholly or partially implemented in hardware. For example, a hardware implementation may employ a look-up table for modification of storage access requests to secure non-disk data.

Certain aspects as described above involve a hardware abstraction layer on top of a host computer. The hardware abstraction layer allows multiple contexts to share the hardware resource. In certain aspects, these contexts are isolated from each other, each having at least a user application running therein. The hardware abstraction layer thus provides benefits of resource isolation and allocation among the contexts. In the foregoing aspects, virtual machines are used as an example for the contexts and hypervisors as an example for the hardware abstraction layer. As described above, each virtual machine includes a guest operating system in which at least one application runs. It should be noted that these aspects may also apply to other examples of contexts, such as Unikernels. Other examples of contexts may also include containers not including a guest operating system, referred to herein as "OS-less containers" (see, e.g., www.docker.com). OS-less containers implement operating system—level virtualization, wherein an abstraction layer is provided on top of the kernel of an operating system on a host computer. The abstraction layer supports multiple OS-less containers each including an application and its dependencies. Each OS-less container runs as an isolated process in userspace on the host operating system and shares the kernel with other containers. The OS-less container relies on the kernel's functionality to make use of resource isolation (CPU, memory, block I/O, network, etc.) and separate namespaces and to completely isolate the application's view of the operating environments. By using OS-less containers, resources can be isolated, services restricted, and processes provisioned to have a private view of the operating system with their own process ID space, file system structure, and network interfaces. Multiple containers can share the same kernel, but each container can be constrained to only use a defined amount of resources such as CPU, memory and I/O. The term "virtualized computing instance" as used herein is meant to encompass both VMs and OS-less containers.

Many variations, modifications, additions, and improvements are possible, regardless the degree of virtualization. The virtualization software can therefore include components of a host, console, or guest operating system that performs virtualization functions. Plural instances may be provided for components, operations or structures described herein as a single instance. Boundaries between various components, operations and data stores are somewhat arbitrary, and particular operations are illustrated in the context of specific illustrative configurations. Other allocations of functionality are envisioned and may fall within the scope of the invention(s). In general, structures and functionality presented as separate components in exemplary configurations may be implemented as a combined structure or component. Similarly, structures and functionality presented as a single component may be implemented as separate components. These and other variations, modifications, additions, and improvements may fall within the scope of the appended claim(s).

We claim:

1. A method of compacting data within a log-structured merge tree (LSM tree) using sharding, comprising:
   determining a size of the LSM tree;
   determining a compaction time for a compaction of the LSM tree based on the size;
   determining a number of compaction entities for performing the compaction in parallel based on the compaction time;
   determining a number of shards based on the number of compaction entities;
   determining a key range associated with the LSM tree;
   dividing the key range by the number of shards into a number of sub key ranges, wherein each of the number of sub key ranges corresponds to a shard of the number of shards;
   assigning the number of shards to the number of compaction entities for compaction; and
   compacting, using at least one hardware processor associated with the number of compaction entities, the data within the LSM tree by compacting the number of shards.

2. The method of claim 1, wherein determining the compaction time is further based on an input/output (I/O) bandwidth and a recovery point objective corresponding to data stored within the LSM tree.

3. The method of claim 2, wherein the I/O bandwidth is associated with at least one of a network over which I/O to the LSM tree is performed or storage resources that store the LSM tree.

4. The method of claim 1, wherein determining the key range is based on examining a catalogue file associated with the LSM tree.

5. The method of claim 1, wherein determining the number of compaction entities is based on a likelihood relating to one or more of the number of compaction entities failing during the compaction.

6. The method of claim 1, wherein:
   determining the number of compaction entities is based on a following formula: Number of Compaction Entities=N*(1+E);

E is a likelihood relating to one or more of the number of compaction entities failing during the compaction;
N equals 2S/(B*T);
N corresponds to an estimated amount of time it takes to compact the data within the LSM tree;
S corresponds to the size of the LSM tree;
B corresponds to an input/output (I/O) bandwidth, which comprises an I/O bandwidth associated with a storage resource storing the data within the LSM tree; and
T corresponds to a recovery point objective associated with the data within the LSM tree.

7. The method of claim 1, wherein the number of shards is higher than the number of compaction entities.

8. The method of claim 1, wherein the number of sub key ranges are non-overlapping.

9. An apparatus, comprising:
   a non-transitory memory comprising executable instructions; and
   a processor in data communication with the memory and configured to execute the instructions to cause the apparatus to:
      determine a size of the LSM tree;
      determine a compaction time for a compaction of the LSM tree based on the size;
      determine a number of compaction entities for performing the compaction in parallel based on the compaction time;
      determine a number of shards based on the number of compaction entities;
      determine a key range associated with the LSM tree;
      divide the key range by the number of shards into a number of sub key ranges, wherein each of the number of sub key ranges corresponds to a shard of the number of shards;
      assign the number of shards to the number of compaction entities for compaction; and
      compact, using at least one hardware processor associated with the number of compaction entities, the data within the LSM tree by compacting the number of shards.

10. The apparatus of claim 9, wherein the processor being configured to cause the apparatus to determine the compaction time comprises the processor being configured to cause the apparatus to determine the compaction time based on an input/output (I/O) bandwidth and a recovery point objective corresponding to data stored within the LSM tree.

11. The apparatus of claim 10, wherein the I/O bandwidth is associated with at least one of a network over which I/O to the LSM tree is performed or storage resources that store the LSM tree.

12. The apparatus of claim 9, wherein the processor being configured to cause the apparatus to determine the key range comprises the processor being configured to cause the apparatus to determine the key range is based on examining a catalogue file associated with the LSM tree.

13. The apparatus of claim 9, wherein the processor being configured to cause the apparatus to determine the number of compaction entities comprises the processor being configured to cause the apparatus to determine the number of compaction entities is based on a likelihood relating to one or more of the number of compaction entities failing during the compaction.

14. The apparatus of claim 9, wherein:
   the processor being configured to cause the apparatus to determine the number of compaction entities comprises the processor being configured to cause the apparatus to determine the number of compaction entities based on a following formula: Number of Compaction Entities=N*(1+E);

E corresponds to a likelihood relating to one or more of the number of compaction entities failing during the compaction;

N equals 2S/(B*T);

N corresponds to an estimated amount of time it takes to compact the data within the LSM tree;

S corresponds to the size of the LSM tree;

B corresponds to an input/output (I/O) bandwidth, which comprises an I/O bandwidth associated with a storage resource storing the data within the LSM tree; and T corresponds to a recovery point objective associated with the data within the LSM tree.

15. The apparatus of claim 9, wherein the number of shards is higher than the number of compaction entities.

16. The apparatus of claim 9, wherein the number of sub key ranges are non-overlapping.

17. A non-transitory computer readable medium having instructions stored thereon that, when executed by a computing system, cause the computing system to perform a method comprising:

determining a size of the LSM tree;

determining a compaction time for a compaction of the LSM tree based on the size;

determining a number of compaction entities for performing the compaction in parallel based on the compaction time;

determining a number of shards based on the number of compaction entities;

determining a key range associated with the LSM tree;

dividing the key range by the number of shards into a number of sub key ranges, wherein each of the number of sub key ranges corresponds to a shard of the number of shards;

assigning the number of shards to the number of compaction entities for compaction; and compacting, using at least one hardware processor associated with the number of compaction entities, the data within the LSM tree by compacting the number of shards.

18. The non-transitory computer readable medium of claim 17, wherein determining the compaction time is further based on an input/output (I/O) bandwidth and a recovery point objective corresponding to data stored within the LSM tree.

19. The non-transitory computer readable medium of claim 18, wherein the I/O bandwidth is associated with at least one of a network over which I/O to the LSM tree is performed or storage resources that store the LSM tree.

20. The non-transitory computer readable medium of claim 17, wherein determining the key range is based on examining a catalogue file associated with the LSM tree.

21. The non-transitory computer readable medium of claim 17, wherein determining the number of compaction entities is based on a likelihood relating to one or more of the number of compaction entities failing during the compaction.

22. The non-transitory computer readable medium of claim 17, wherein:

determining the number of compaction entities is based on a following formula: Number of Compaction Entities=N*(1+E);

E corresponds to a likelihood relating to one or more of the number of compaction entities failing during the compaction;

N equals 2S/(B*T);

N corresponds to an estimated amount of time it takes to compact the data within the LSM tree;

S corresponds to the size of the LSM tree;

B corresponds to an input/output (I/O) bandwidth, which comprises an I/O bandwidth associated with a storage resource storing the data within the LSM tree; and T corresponds to a recovery point objective associated with the data within the LSM tree.

23. The non-transitory computer readable medium of claim 17, wherein the number of shards is higher than the number of compaction entities.

24. The non-transitory computer readable medium of claim 17, wherein the number of sub key ranges are non-overlapping.

* * * * *